US008289068B2

(12) United States Patent
Brueckl et al.

(10) Patent No.: US 8,289,068 B2
(45) **Date of Patent: *Oct. 16, 2012**

(54) METHOD FOR SWITCHING WITHOUT ANY INTERRUPTION BETWEEN WINDING TAPS ON A TAP-CHANGING TRANSFORMER

(75) Inventors: Oliver Brueckl, Waldmuenchen (DE); Dieter Dohnal, Lappersdorf (DE); Hans-Henning Lessmann-Mieske, Neutraubling (DE)

(73) Assignee: Maschinenfabrik Reinhausen GmbH, Regensburg (DE)

( * ) Notice: Subject to any disclaimer, the term of this patent is extended or adjusted under 35 U.S.C. 154(b) by 90 days.

This patent is subject to a terminal disclaimer.

(21) Appl. No.: 12/989,427

(22) PCT Filed: Aug. 27, 2008

(86) PCT No.: PCT/EP2008/007003

§ 371 (c)(1), (2), (4) Date: Nov. 27, 2010

(87) PCT Pub. No.: WO2010/022751

PCT Pub. Date: Mar. 4, 2010

(65) Prior Publication Data

US 2011/0102056 A1 May 5, 2011

(51) Int. Cl.
*H03K 17/60* (2006.01)

(52) U.S. Cl. ......... 327/478; 327/108; 327/112; 327/427

(58) Field of Classification Search .......... 327/427–478; 326/22–27, 81–87
See application file for complete search history.

(56) References Cited

U.S. PATENT DOCUMENTS

| | | | | |
|---|---|---|---|---|
| 5,969,511 | A | 10/1999 | Asselman | |
| 7,046,051 | B2 * | 5/2006 | Melbert et al. | 327/110 |
| 7,538,587 | B2 * | 5/2009 | Iwagami et al. | 327/108 |
| 7,944,250 | B2 * | 5/2011 | Jansen | 327/108 |
| 7,965,126 | B2 * | 6/2011 | Honea et al. | 327/424 |
| 2004/0085117 | A1 * | 5/2004 | Melbert et al. | 327/432 |

FOREIGN PATENT DOCUMENTS

| | | | |
|---|---|---|---|
| WO | 0122447 | A | 3/2001 |

* cited by examiner

*Primary Examiner* — Lincoln Donovan
*Assistant Examiner* — Brandon S Cole
(74) *Attorney, Agent, or Firm* — Andrew Wilford

(57) ABSTRACT

The invention relates to a method for switching without any interruption between two winding taps (tap n, tap n+1) of a tap-changing transformer, wherein each of the two winding taps is connected to the common load output line via in each case one mechanical switch (Ds) and a series circuit, arranged in series thereto, comprising two IGBTs (Ip, In) which are switched in opposite directions.

3 Claims, 4 Drawing Sheets

METHOD FOR SWITCHING WITHOUT ANY INTERRUPTION BETWEEN WINDING TAPS ON A TAP-CHANGING TRANSFORMER

CROSS REFERENCE TO RELATED APPLICATIONS

This application is the US national stage of PCT application PCT/EP2008/007003, filed 27 Aug. 2008, published 4 Mar. 2010 as 2010/022751, and claiming the priority of PCT patent application PCT/EP2008/007003 itself filed 27 Aug. 2008, whose entire disclosures are herewith incorporated by reference.

FIELD OF THE INVENTION

The invention relates to a method of uninterrupted changeover by semiconductor switching elements between winding taps of a tapped transformer.

BACKGROUND OF THE INVENTION

Such a method with use of semiconductor switching elements is known from WO 2001/022447. The method described there operates not only with electrical switching means, i.e. insulated gate bipolar transistors known as IGBTs, but also mechanical contacts. It is designed so that the actual load changeover takes place at the zero transition of the load current by two IGBTs with diodes in rectifier-circuit arrangement. A necessary component of this known method is the recognition and detection of the respective current zero transition as a precondition for initiating the load changeover at this instant.

A further method with an IGBT switching arrangement, in which the taps of the regulating winding of a power transformer are connected by a series connection of two IGBTs with a common load shunt, is known from WO 1997/005536 [U.S. Pat. No. 5,969,511]. This known method operates according to the principle of pulse width modulation; in a further method step, limitation of the current is in that case carried out by the transient reactive reactance (TER) of the tapped winding. This method requires a specific adaptation of the on-load tap changer to the respective tapped transformer to be connected. In other words, the tapped transformer and the on-load tap changer have to be matched to one another and interact electrically. This known method is therefore not suitable for use in a separate, universally usable on-load tap changer not tailor-made for a specific transformer.

OBJECT OF THE INVENTION

It is the object of the invention to provide a method of the kind described above that is of simple construction and has a high level of functionality and in which it is not necessary to be obliged to switch only precisely at the zero transition of the load current. A further object of the invention is to provide a corresponding method functionally capable in every case, i.e. without matching to the actual tapped transformer to be connected.

SUMMARY OF THE INVENTION

This object is fulfilled by a method that proceeds from the general inventive concept to use varistors not—as known for a long time from the prior art—as components for overvoltage protection, but for commutation of the load current of the on-load tap changer from one side to the other, i.e. from the previously connected winding tap to the new winding tap to be connected, by appropriate method steps.

In the method according to the invention the specially dimensioned varistors connected in parallel with each IGBT exercise a new function: after commutation of the imposed load current, which is provided by the mains voltage, from the IGBT switching off to the varistor disposed in parallel (small commutation circuit), the varistor which conducts the load current builds up—in correspondence with its I-U characteristic—a voltage which exhibits a relatively small dependence on the instantaneous value of the current and remains virtually constant during the switching-over process of the OLTC.

The varistors are in that case so dimensioned that the varistor voltage which arises in the case of loading with the peak value of the maximum current still has a sufficient safety margin relative to the maximum blocking voltage of the IGBTs. On the other hand, the clamping voltage of the varistors ($U_{var}$ at 1 milliamp) has to lie significantly above the peak value of the maximum tap voltage so that the load current can commutate from the OLTC side, which is switching off, via the tap voltage to the side taking over the load current (large commutation circuit).

The difference DU between instantaneous value of the voltage drop at the varistor and the instantaneous value of the tap voltage produces commutation of the load current by way of the leakage inductance of the tapped winding and the line inductances on the side of the on-load tap changer taking over and determines the di/dt of the commutating process ($AU=L_{com}\cdot di/dt$).

It is apparent that within the scope of the method according to the invention the varistors do not function, as known in the prior art, for reducing transient over-voltages. In the present invention the varistors take over the following functions, which are untypical for their category and which are not suggested by the prior art, as a component of the method:

- taking over the load current from the IGBTs switching off hard,
- generating a voltage drop which independently of the instantaneous value of the load current has to lie in a voltage band between the maximum blocking voltage of the IGBTs and the peak value of the maximum tap voltage and providing a voltage/time area which commutates the load current from the current-conducting side of the on-load tap changer via the oppositely directed tap is voltage to the on-load tap changer side taking over:

$$\int_{Var} U dt = L^{Kom} \cdot I_L(t) + \int U_{st} dt$$

The provision of the functions, which are listed in the foregoing, by the varistors simplifies and relieves the electronic power commutation process in a decisive way:

Very small energy intake in the IGBTs switching hard.

The loss energy $$W_k \approx \int_0^{t_k} U_{Var} \cdot \left( I_L(t) - \frac{di}{dt} \cdot t \right) dt$$

necessarily arising in the commutation process at the side switching off is accepted predominantly by the varistor and only to a small extent by the IGBT switching off, particularly in the case of high commutation demands (high instantaneous value of the load current, high instantaneous value of an oppositely directed tap voltage, large leakage inductance of the switched tap).

This fact allows very simple and economic dimensioning of the electronic power switching groups, because the energy-receiving volume in the case of the varistor is flexibly variable and unequal to and larger than the very much smaller, more expensive volume, which is capable of volume variation only with difficulty, of the IGBT chip.

A very large tolerance field with respect to the synchronisation of the switch-off instant of the IGBT group switching off and the switch-on instant of the IGBT group taking over arises as a further positive effect of the load current conductance by the varistors, the provision of the required commutation voltage/time area by the varistors and the acceptance of the then-occurring loss energy similarly by the varistors. The following switching modes are possible and permissible:

With Gaps

Switching-off process of the side switching out takes place before the switching-on process of the side taking over. The current flow time of the load current over one of the two varistors of the side switching off is correspondingly extended.

Simultaneous

Switching-off process and switching-on process of the two IGBT groups take place simultaneously. In the standard case, no additional load-current loading times at the varistor.

Overlapping

Switching-on process of the on-load tap changer side taking over takes place before the switching-off process of the side switching out. During the overlap time the two IGBT groups are closed, so that the tap voltage in this time period begins to build up a circulation current. The di/dt of the circulation current which is forming depends on the instantaneous value of the tap voltage in the overlap time period and on the circular is inductance of the circulation current. The circulation current is added on the side switching off to the load current and up to the moment of the switching-off process leads to a gradual rise in the sum of the current to be commutated down ($I_L(t)+I_c(t)$). This leads to an increase in the commutation loss energy arising at the side switching off and to a lengthening of the commutation process.

The method according to the invention has a number of advantages relative to the state of the art:

The smallest losses and shortest commutation times are achieved with simultaneous switching-off and switching-on of the two IGBT groups.

If in the course of the operating year an overlapping or gapped switching-over behavior in an order of magnitude of approximately ±10 microseconds should arise due to component ageing and shift in operating point in the electronic drive system, there is no resulting risk to function in the switching concept according to the invention. The sole consequences are moderately increasing commutation losses and a somewhat lengthened commutation time.

In all three switching modes explained in the foregoing the ohmic/resistive energy take-up of the varistors produces a marked attenuation of the current and voltage courses in the changeover process as an important positive side effect. Due to the strong attenuating action of the varistors, disruptive oscillations, which would be expected in the case of rapid commutation processes (order of magnitude of 10 microseconds) of that kind in conjunction with the winding capacitances and leakage inductances of the tapped winding itself, cannot form. Added to that is the fact that the voltage forming at the varistors as a consequence of the load current flow is relatively constant and as a result produces a constant di/dt during the commutation process. As a consequence of this fact, a strong oscillation excitation is in addition impeded.

In the case of very high load currents it is possible to provide, in a manner known per se, a current zero transition detection and to perform the changeover or commutation process at very small instantaneous values of the load current with proximity in terms of time to the current zero transition. This measure leads to a drastic reduction in the current loading of IGBTs and varistors as well as in the commutation loss energy and to a shortening of the commutation time. Switching-over in the vicinity of the current zero transition allows a significant increase in the contact rating data of the on-load tap changer with unchanged hardware of the electronic power components.

BRIEF DESCRIPTION OF THE DRAWING

The method will be explained in more detail in the following by way of example on the basis of drawings, in which.

DETAILED DESCRIPTION

Figure 1:
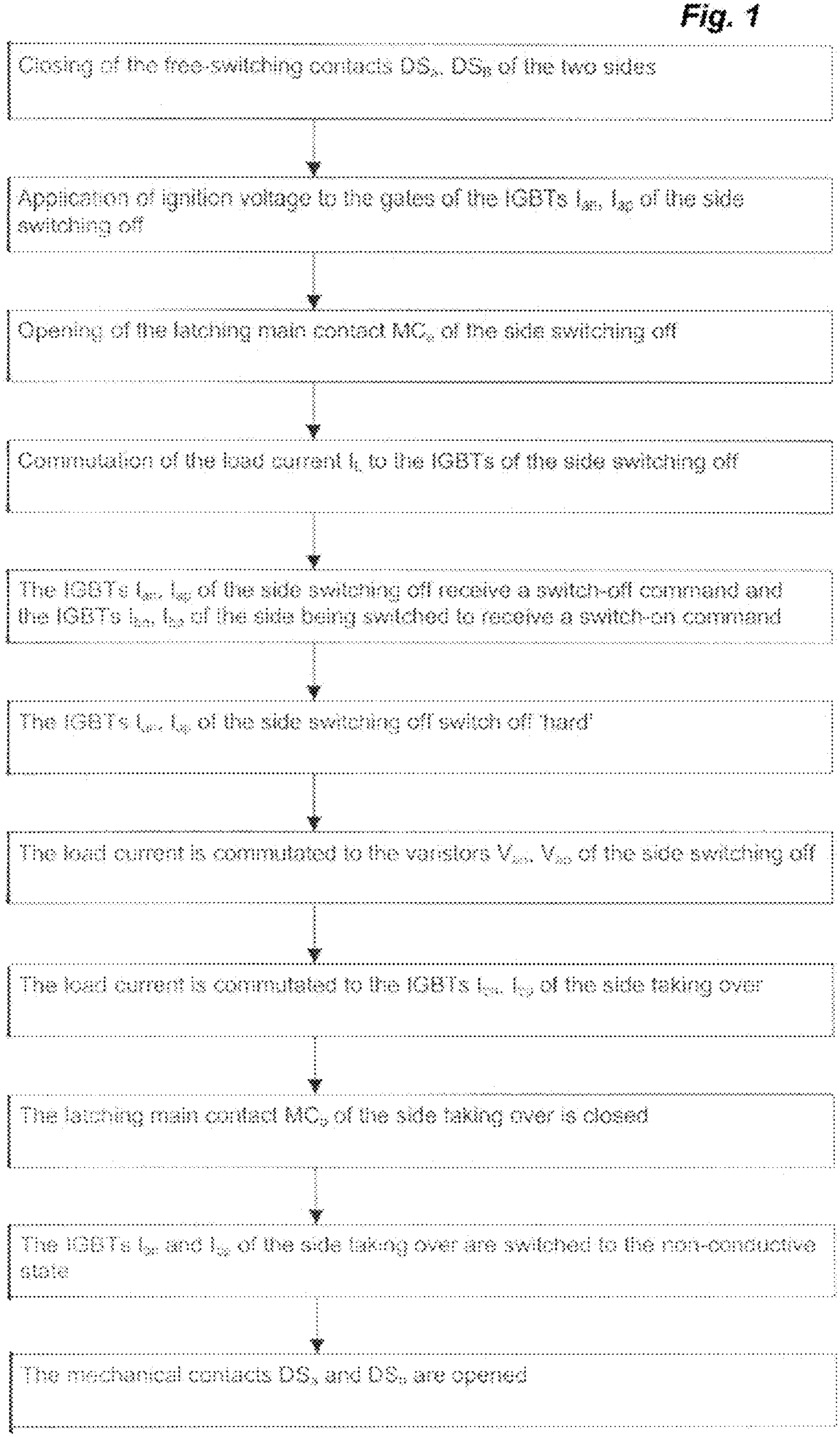
FIG. 1 shows a schematic flow chart of a first method according to the invention.

FIG. 1 shows a schematic flow chart of a first method according to the invention. The method proceeds from the fact that in the case of an on-load tap changer in which switching over from a previous winding tap of a tapped transformer to a new winding tap is to take place two load branches are provided which can be electrically connected with a common load output line by way of a mechanical switch $DS_a$, $DS_b$ and a series circuit, which is arranged in series therewith, consisting of two oppositely connected IGBTs $I_{an}$, $I_{ap}$; $I_{bn}$, $I_{bp}$ each with a respective diode $d_n$, $d_{ap}$; $d_{bn}$, $d_{bp}$ in parallel, and that a respective varistor $V_{an}$, $V_{ap}$; $V_{bp}$ is connected in parallel with each of the IGBTs. Each of the two load branches shall be capable of being bridged over by a latching main contact $MC_a$ or $MC_n$.

As a first step the mechanical switches $DS_a$ and $DS_b$, which act as free-switching contacts, of both sides are closed. Subsequently, an ignition voltage is applied to the gates of the IGBTs $I_{an}/I_{ap}$ of the side switching off. The latching main contact $MC_a$ of the side switching off is thereafter opened. The commutation of the load current $I_L$ to the IGBTs of the side switching off takes place further subsequently. These IGBTs $I_{an}$, $I_{ap}$ of the side switching off now receive a switch-off command, while the IGBTs $I_{bn}$, $I_{bp}$ of the side being switched on receive a switch-on command. The IGBTs $I_{an}$, $I_{ap}$ of the side switching off consequently switch off 'hard'. According to the invention the load current is now commutated to the varistors $V_{an}$ and $V_{ap}$, of side switching off. Subsequently, this load current is commutated to the IGBTs $I_{bn}$, $I_{bp}$ of the side taking over and to be switched to. The latching main contact $MC_b$ of the side taking over is closed further subsequently. The IGBTs $I_{bn}$ and $I_{bp}$ of the side taking over are then switched to the non-conductive state. The last method step consists of opening the mechanical contacts $DS_a$ and $DS_b$ protecting the IGBTs from the transient voltage loads which can be effective at the tapped winding.

Figure 2:
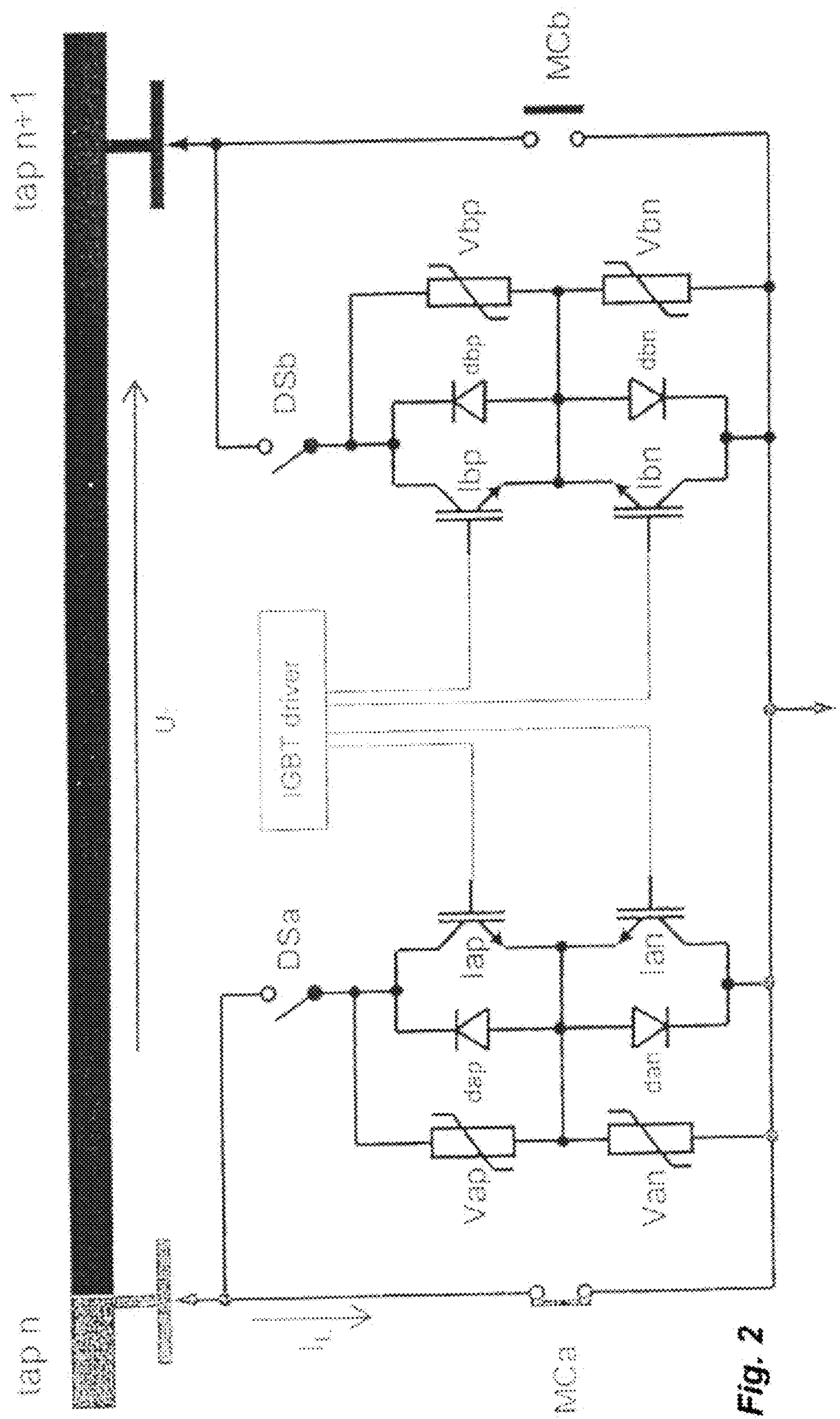
FIG. 2 shows a first circuit, which is particularly suitable for performance of the method, with IGBTs and with varistors connected in parallel with each IGBT.

FIG. 2 shows a circuit which is particularly suitable for realization of the method according to FIG. 1. In that case, each of the two winding taps tap n and tap n+1 are connected with the on-load tap changer load output line by way of a mechanical switch $DS_a$ or $DS_b$ with a series circuit consisting of two oppositely connected IGBTs $I_{an}$ and $I_{ap}$ on the side n as well as $I_{bn}$ and $I_{bp}$ on the side n+1. A diode $d_{an}$, $d_{ap}$; $d_{bn}$, $d_{bp}$ is provided in parallel with each IGBT, wherein the two diodes in each load branch are connected oppositely to one another. A respective varistor $V_{an}$, $V_{ap}$ or $V_{bn}$, $V_{bp}$ is also provided in parallel with each individual IGBT. Finally, the latching main contacts $MC_a$ and $MC_b$, which respectively bridge over the entire switching device in steady-state operation, of each side are also illustrated. The IGBTs $I_{an}$, $I_{ap}$; $I_{bp}$, $I_{bp}$ of the two sides are driven by a common IGBT driver which is illustrated only schematically and which is known from the prior art.

The varistors $V_{an}$, $V_{ap}$ or $V_{bn}$, $V_{bp}$ are dimensioned in such a manner that the varistor voltage thereof is lower than the maximum blocking voltage of the respectively parallel IGBTs, but higher than the maximum instantaneous value of the tap voltage.

The method according to the invention, i.e. a changeover sequence from, for example, tap n to tap n+1, will be explained in more detail again in the following on the basis of this circuit:

In the basic position, the load current flows via the latching main contact $MC_a$ from tap n to the on-load tap changer load output line Y.

As a first step of the changeover sequence the free-switching contacts $DS_a$ and $DS_b$ are closed. Subsequently, ignition voltage is applied to the gates of the IGBTs $I_{an}$ and $I_{ap}$. The latching main contact $MC_a$ now opens and commutates the load current $I_L$ to the IGBT group $I_{an}/I_{ap}$. After less than ten milliseconds duration of flow of current $I_L$ by way of the IGBT group $I_{an}/I_{ap}$ these IGBTs receive a switch-off command and the IGBT group $I_{bn}/I_{bp}$ simultaneously (at least in the standard case) receives a switch-on command.

The voltage building up at the IGBT which is switching off transfers to the varistor disposed in parallel. When after a few 100 nanoseconds the clamping voltage of the varistor is attained, the varistor begins to conduct and the voltage at the IGBT divides into two components:

- the only still slightly rising varistor voltage
- the L·di/dt of the small commutation circuit between IGBT and parallel varistor.

As a consequence of the coupling, which is very low in inductance, of the varistor to the IGBT the commutation of the maximum load current from the IGBT to the varistor takes place within 0.1 . . . 1 microseconds.

The varistor is so dimensioned that the voltage of the varistor conducting load current on the one hand moves below the maximum blocking voltage of the parallel IGBTs and on the other hand above the maximum instantaneous value of the tap voltage. The excess of the instantaneous value of the varistor voltage above the instantaneous value of the tap voltage causes downward commutation of the load current at an approximately constant di/dt from the side A and pushing over via the tap voltage and the leakage inductance of the tapped winding $L_s$ (large commutation circuit) at the same di/dt (in this case positive) to the side B. Notwithstanding the continuously decreasing current flowing through the varistor on side A, the varistor voltage remains constant to a first approximation.

After approximately 10 microseconds the entire load current is commutated over from the varistor, which conducts current, of the side A to the conductive IGBTs of the side B. With approximation of the current of the side A to the value 0, the voltage at the switching group A changes fundamentally:

The varistor voltage collapses, the transient $$L_\sigma(di/dt)$$

is overcome and appearing at the IGBT/varistor group A is the tap voltage, which depending on the polarity arises at one blocking IGBT and the respective varistor lying in parallel. Even in the case of loading with the peak voltage of the tap voltage, the varistor still does not allow any significant current flow.

Less than 10 milliseconds after the electronic power commutation of the load current from side A to side B the latching main contact $MC_b$ closes and shunts the IGBT group B. The IGBTs $I_{bn}$, $I_{bp}$ are subsequently switched to the non-conductive state by way of the gate drive. The changeover sequence ends with opening of the mechanical free-switching contacts $DS_a$ and $DS_b$, which protect the IGBTs from transient voltage loads which can be effective at the tapped winding.

Figure 3:
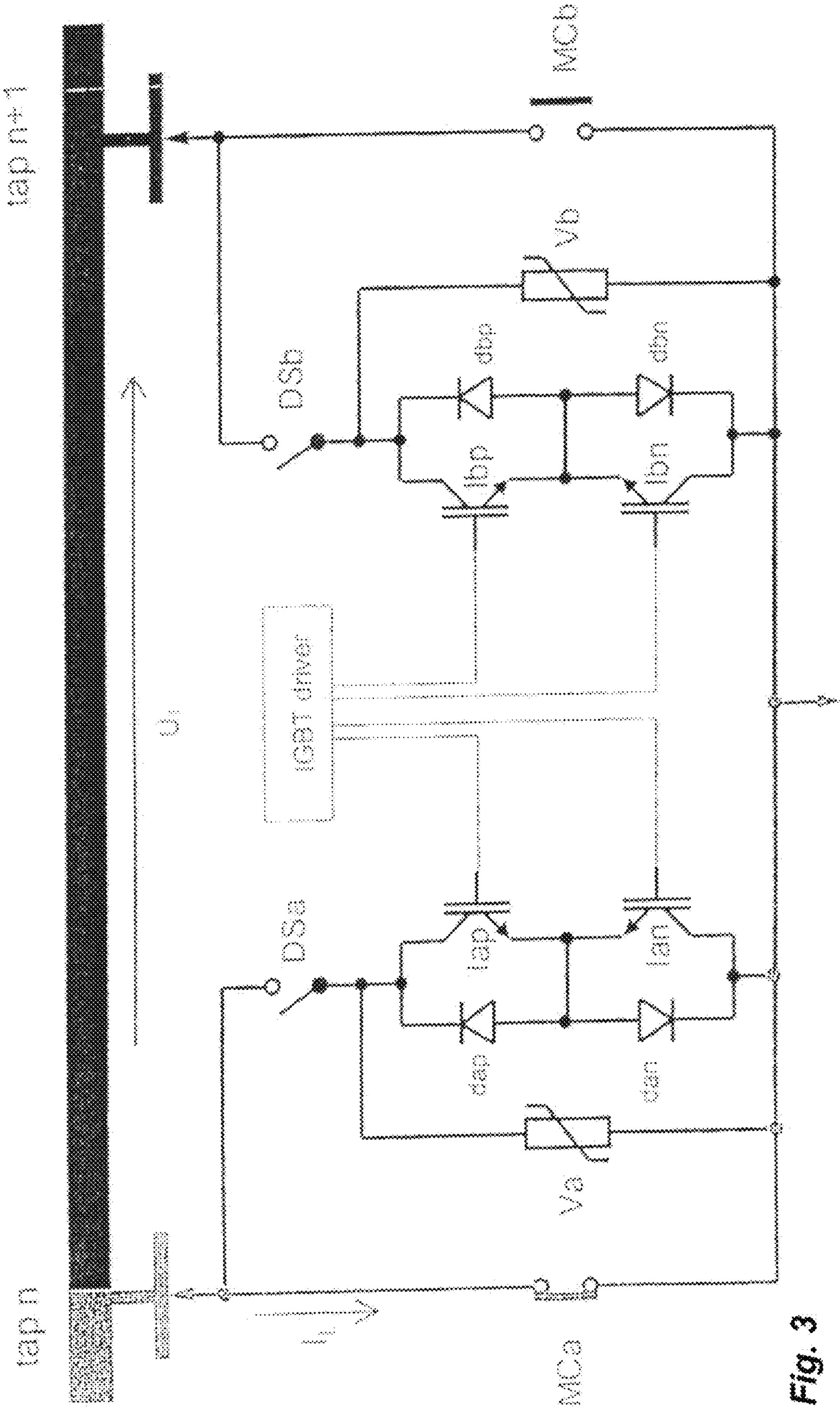
FIG. 3 shows a further, modified circuit for performance of the method

A modified circuit suitable for performance of the method is illustrated in FIG. 3, in which the two varistors $V_{an}$, $V_{ap}$ or $V_{bn}$, $V_{bp}$ of the same side are respectively combined to form a respective common varistor $V_a$ or $V_b$. In that case the respective mechanical switch $DS_a$ or $DS_b$ of each side and the respective varistor $V_a$ or $V_b$ of the associated side similarly forms a series circuit toward the common load output line.

Figure 4:
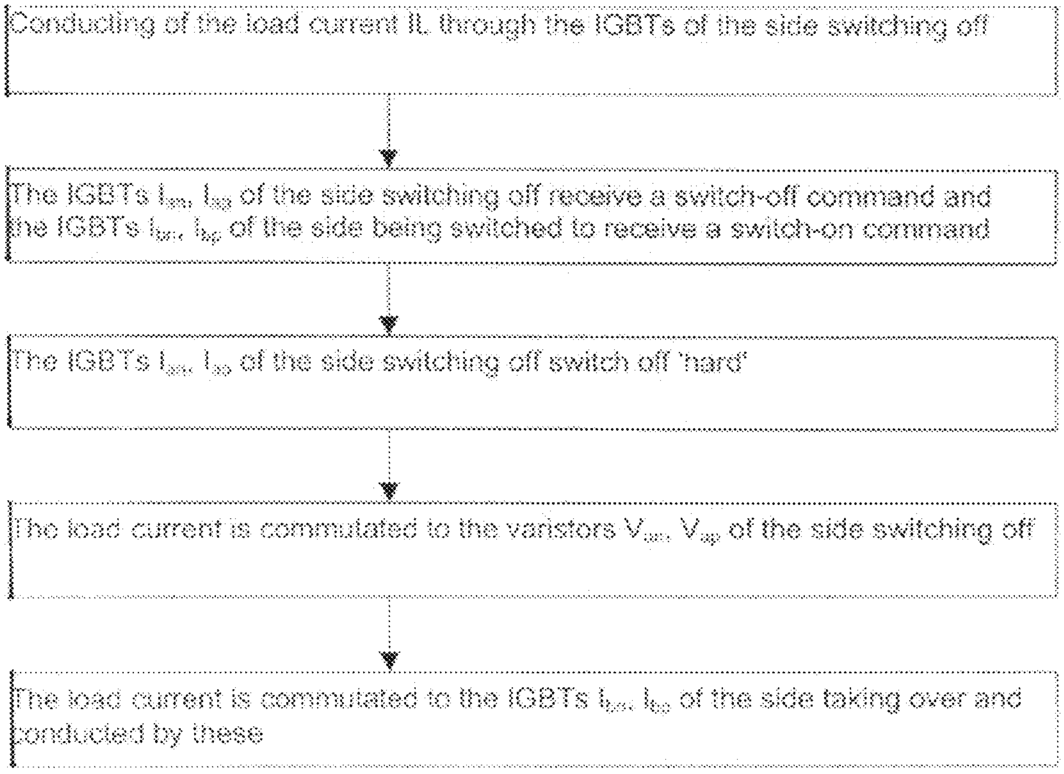
FIG. 4 shows a schematic flow chart of a second, simplified method according to the invention.

A further, modified method according to the invention is shown in FIG. 4, which proceeds from a simplification of the sequence and in which no mechanical switch is provided. The general inventive concept of using varistors for commutation of the load current is also realized in this method. This further method starts from the point that in the case of an on-load tap changer two load branches are again provided, wherein each of the two load branches contains a series circuit consisting of two oppositely connected IGBTs $I_{an}$, $I_{ap}$; $I_{bn}$, $I_{bp}$, with each of which a respective diode $d_{an}$, $d_{ap}$; $d_{bn}$, $d_{bp}$ is connected in parallel. A respective varistor $V_{an}$, $V_{ap}$; $V_{bn}$, $V_{bp}$ is connected in parallel with each of the IGBTs $I_{an}$, $I_{ap}$; $I_{bn}$, $I_{bp}$.

At the beginning of the changeover the IGBTs $I_{an}$ and $I_{ap}$ of the side switching off conduct the load current. Subsequently, these IGBTs receive a switch-off command and the IGBTs $I_{bn}$ and $I_{bp}$ of the side being switched to receive a switch-on command; the IGBTs of the side switching off switch off 'hard'. According to the invention, the load current is subsequently commutated to the varistors $V_{an}$ and $V_{ap}$ of the side switching off. The load current is again subsequently commutated to the IGBTs $I_{bn}$ and $I_{bp}$ of the side taking over and conducted by these.

As already explained, this simplified method starts from an on-load tap changer which does not have any mechanical free-switching contacts or any mechanical latching main contacts, but in which the load current is conducted in steady-state operation by the IGBTs. Both methods, not only the method illustrated in FIG. 1, but also the method illustrated in FIG. 4, follow the same inventive concept and fulfil the object of the invention in the same manner.

Finally, the advantages, which were already explained in detail further above, of the method according to the invention by comparison with the prior art will be summarized once again.

- option of changing over at any desired instantaneous is value of the load current without thermal overloading of the IGBTs,
- extraordinarily rapid commutation process of the load current from the on-load tap changer side A in the direction of B or B in the direction of A within approximately 10 microseconds, avoidance of disruptive oscillations, an order-specific adaptation of each on-load tap changer to the actual rated tap data of the order details (tap voltage, rated transient current, leakage inductance) is redundant as long as the limit values of tap voltage and rated transient current are not exceeded, and robust, intrinsically reliable commutation concept with a very large tolerance range with respect to switching time drift between the two IGBT switching groups, no re-adjustment after a longer operating time being required.

The invention claimed is:

1. A method of uninterrupted changeover between winding taps of a tapped transformer with two load branches each connectable with a common load output line by a respective mechanical switch and a respective series circuit in series therewith and consisting of two oppositely connected IGBTs, a respective diode being connected in parallel with each IGBT, a respective varistor being provided in parallel with each IGBT and each of the two load branches being bridgeable by a mechanical latching main contact, the method comprising the following steps:

closing the mechanical switches of the two branches, applying ignition voltage to gates of the IGBTs of the branch switching off and thus switching on those IGBTs, opening a latching main contact of the branch switching off, diverting load current to the IGBTs of the branch switching off, switching off the IGBTs of the branch switching off and switching on the IGBTs of the branch being switched on so as to hard switch off the IGBTs of the branch switching off, thereafter diverting the load current to the varistors of the branch switching off, thereafter diverting the load current to the IGBTs of the branch taking over, closing the latching main contact of the branch taking over, switching off the IGBTs of the branch taking over and opening the mechanical contacts of the two branches.

2. The method according to claim 1, further comprising the steps of:

detecting a current zero transition and effecting the changeover or diversion cotemporaneously with the current zero transition of the load current.

3. A method of uninterrupted changeover between winding taps of a tapped transformer with two load branches each having a series circuit consisting of two oppositely connected IGBTs, a respective diode connected in parallel with each IGBT, and a respective varistor connected in parallel with each IGBT, the method comprising the following steps:

conducting the load current initially through the IGBTs of the branch switching off, subsequent switching off of the IGBTs of the branch switching off and switching on the IGBTs of the branch switching on so as to hard switch off the IGBTs of the branch switching off, thereafter diverting load current to the varistors of the branch switching off, and thereafter diverting the load current to the IGBTs of the branch taking over and conducting the load current therethrough.

* * * * *